(12) United States Patent
Miller et al.

(10) Patent No.: US 6,701,270 B1
(45) Date of Patent: Mar. 2, 2004

(54) METHOD FOR RELIABILITY TESTING LEAKAGE CHARACTERISTICS IN AN ELECTRONIC CIRCUIT AND A TESTING DEVICE FOR ACCOMPLISHING THE SOURCE

(75) Inventors: Leah M. Miller, Fremont, CA (US); Anand Govind, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 236 days.

(21) Appl. No.: 09/957,410

(22) Filed: Sep. 20, 2001

(51) Int. Cl.[7] .................... G06F 19/00; G01R 31/28
(52) U.S. Cl. .................... 702/117; 714/724; 324/500
(58) Field of Search .................... 324/500, 512, 324/327, 537, 754, 761; 702/117, 118, 120; 714/1, 25, 724, 734

(56) References Cited

U.S. PATENT DOCUMENTS

| | | | | |
|---|---|---|---|---|
| 5,124,636 A | * | 6/1992 | Pincus et al. ............ | 324/158.1 |
| 5,457,380 A | * | 10/1995 | Blumenau ................ | 324/158.1 |
| 5,968,192 A | * | 10/1999 | Kornachuk et al. ......... | 714/724 |
| 6,127,834 A | * | 10/2000 | Eliashberg et al. ......... | 324/760 |
| 6,291,978 B1 | * | 9/2001 | Chandler et al. .......... | 324/73.1 |
| 6,351,134 B2 | * | 2/2002 | Leas et al. .................. | 324/765 |
| 6,397,361 B1 | * | 5/2002 | Saitoh ........................ | 714/724 |
| 2002/0132382 A1 | * | 9/2002 | Hebert et al. ................ | 438/17 |
| 2003/0057990 A1 | * | 3/2003 | West .......................... | 324/765 |

* cited by examiner

Primary Examiner—Patrick Assouad
(74) Attorney, Agent, or Firm—Hitt Gaines, P.C.

(57) ABSTRACT

The present invention provides a method for reliability testing leakage characteristics in an electronic circuit, and a testing device for accomplishing the same. In an advantageous embodiment, the method includes dividing conductors of an electronic circuit into at least first and second noninterleaved regions having at least two conductors each. The method further includes forming conductor nets by electrically connecting ones of the at least two conductors of the first region to ones of the at least two conductors of the second region then testing for electrical leakage in the conductor nets.

20 Claims, 8 Drawing Sheets

METHOD FOR RELIABILITY TESTING LEAKAGE CHARACTERISTICS IN AN ELECTRONIC CIRCUIT AND A TESTING DEVICE FOR ACCOMPLISHING THE SOURCE

TECHNICAL FIELD OF THE INVENTION

The present invention is directed, in general, to a method of testing and, more specifically, to a method for reliability testing leakage characteristics in an electronic circuit and a testing device for accomplishing the same.

BACKGROUND OF THE INVENTION

Reliability of electronic devices, namely traces in semiconductor devices, is of great concern in today's competitive electronic markets. The reliability of a certain electronic device, however, may not be known until the electronic device is used for a long period of time. For example, it might take up to two years for a particular electronic device to experience reliability issues caused by normal operation.

This lag in time between manufacturing the particular electronic device and the emergence of a reliability issue, is particularly problematic. The lag time tends to drive manufacturers in the electronic industry to continue to manufacture the electronic devices without having the appropriate reliability data. In many instances, the severely delayed reliability data is returned as negative reliability data, and an entire lot of electronic devices may need to be discarded. Discarding the electronic devices causes the manufacturing cost of the devices to increase dramatically, a cost which is ultimately passed on to the consumer.

Currently, in an effort to promptly determine the reliability of the electronic device, and therefore reduce manufacturing cost, manufacturers have begun to use accelerated testing. One form of accelerated testing involves biasing all traces in the electronic device, in an attempt to accelerate the development of electrical leakage between the traces. The biasing scheme is ordinarily conducted in an environment of increased temperature and moisture, which tends to further accelerate the development of electrical leakage between the traces.

After biasing all of the traces for a specified period of time, the electronic device is tested for electrical leakage. Dendrites, which may form across any two traces forming an electrical leakage, are of particular concern, however, any leakage mechanism may be detected. The accelerated testing is particularly beneficial, in that it can determine reliability data relatively quickly, for example, on the order of a few weeks of time, as compared to up to about two years if the reliability is based upon normal operation.

Problems, however, currently exist with the accelerated testing method described above. One problem is the amount of time and effort required to perform such tests. For example, it takes a large amount of time and effort to individually bias each adjacent trace, then subsequently test each trace for electrical leakage against every other trace in the electronic device. Moreover, to test each trace as described above requires that a special high pin count tester, or multiple passes of a lower pin count tester, be used to complete the testing of the entire electronic device. Such a process is also time consuming and expensive. A method for correcting the above problems might include testing only a portion of the conductors. However, while this might save time and effort, it only provides an approximation of the reliability data, and approximations are typically considered inadequate reliability measurements.

Accordingly, what is needed in the art is a method of testing reliability of an electronic device that does not experience the drawbacks experienced by the prior art methods.

SUMMARY OF THE INVENTION

To address the above-discussed deficiencies of the prior art, the present invention provides a method for reliability testing leakage characteristics in an electronic circuit and a testing device for accomplishing the same. In an advantageous embodiment, the method includes dividing conductors of an electronic circuit into at least first and second noninterleaved regions having at least two conductors each. The method further includes forming conductor nets by electrically connecting ones of the at least two conductors of the first region to ones of the at least two conductors of the second region, then testing for electrical leakage in the conductor nets.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
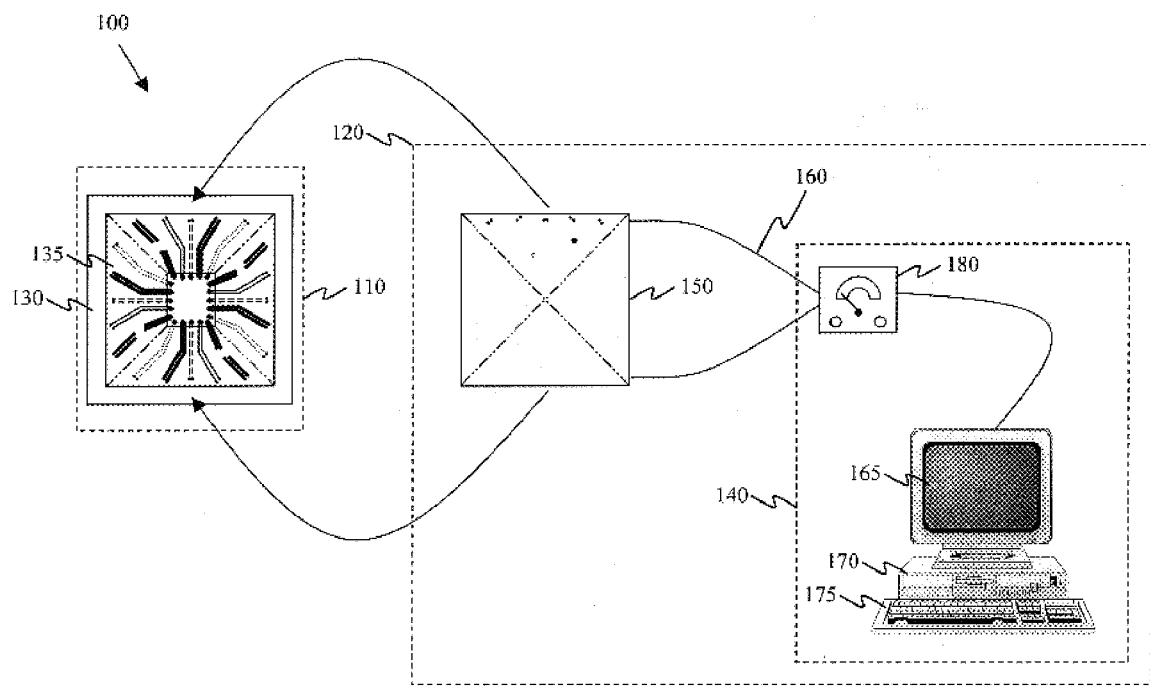
FIG. 1 illustrates a plan view of an exemplary embodiment of a system for reliability testing leakage characteristics in an electronic circuit, which may be used in accordance with the principles of the present invention.

Referring initially to FIG. 1, illustrated is a plan view of an exemplary embodiment of a system 100 for reliability testing leakage characteristics in an electronic circuit, which may be used in accordance with the principles of the present invention. It should initially be noted that the system 100 may include many objects, and it should in no way be limited to what is illustrated in the embodiment shown in FIG. 1.

In the illustrative embodiment, the system 100 includes a circuit subsystem 110 and a testing subsystem 120. The circuit subsystem 110, in a preferred embodiment of the invention, may include a reliability test board 130 that accepts an electronic circuit 135. The reliability test board 130 divides the electronic circuit 135 into at least first and second noninterleaved regions of at least two conductors each, and electrically connects ones of the at least two conductors of the first region to ones of the at least two conductors of the second region.

In an exemplary embodiment, the reliability test board 130 may include a socket which connects the electronic circuits of the package to a device under test (DUT) board. The DUT board may be a separate printed circuit board which is specifically designed for testing the electronic circuit 135. For example, the DUT board may be specifically designed to electrically connect specific pairs of conductors within the regions. The DUT board may allow the conductors of the electronic circuit 135 to remain independent in the package, however, become conductor nets when the electronic circuit 135 is mounted thereto.

As previously mentioned, the system 100 may further include the testing subsystem 120. The testing subsystem 120 may include any subsystem capable of accurately testing the above-mentioned conductor nets for electrical leakage. In the embodiment illustrated in FIG. 1, the testing subsystem 120 includes a computer subsystem 140. The computer subsystem 140 may be coupled to a testing circuitry 150, such as a pin tester, via a cable 160, and may be configured to take, receive and process electrical test information of the electronic circuit 135. The computer subsystem 140 may further be coupled to biasing circuitry 180, which in turn may be coupled to the reliability test board 130 and used to bias the various conductor nets. In one embodiment of the present invention, the computer subsystem 140 may be software residing on a conventional personal computer. The software embodiment includes source code, object code, libraries, executable programs and other software structures that cooperatively function together to achieve the functionality of the present invention. The computer subsystem 140 may also include a monitor 165, a chassis 170 or a keyboard 175. Alternatively, however, the monitor 165 and the keyboard 175 may be replaced by other conventional output and input devices, respectively.

It should be noted that any conventional computer system having at least one CPU that is suitable to function as the computer subsystem 140, including without limitation, hand-held units, laptop/notebooks, minis, mainframes and supercomputers, including RISC and parallel processing architectures, as well as combinations of such systems, may be used. Conventional computer system architecture is more fully discussed in *Computer Organization and Architecture*, by William Stallings, MacMillan Publishing Co. (3rd ed. 1993), which is also incorporated herein by reference. Alternative computer system embodiments may be firm-or hardware-based.

Figure 2:
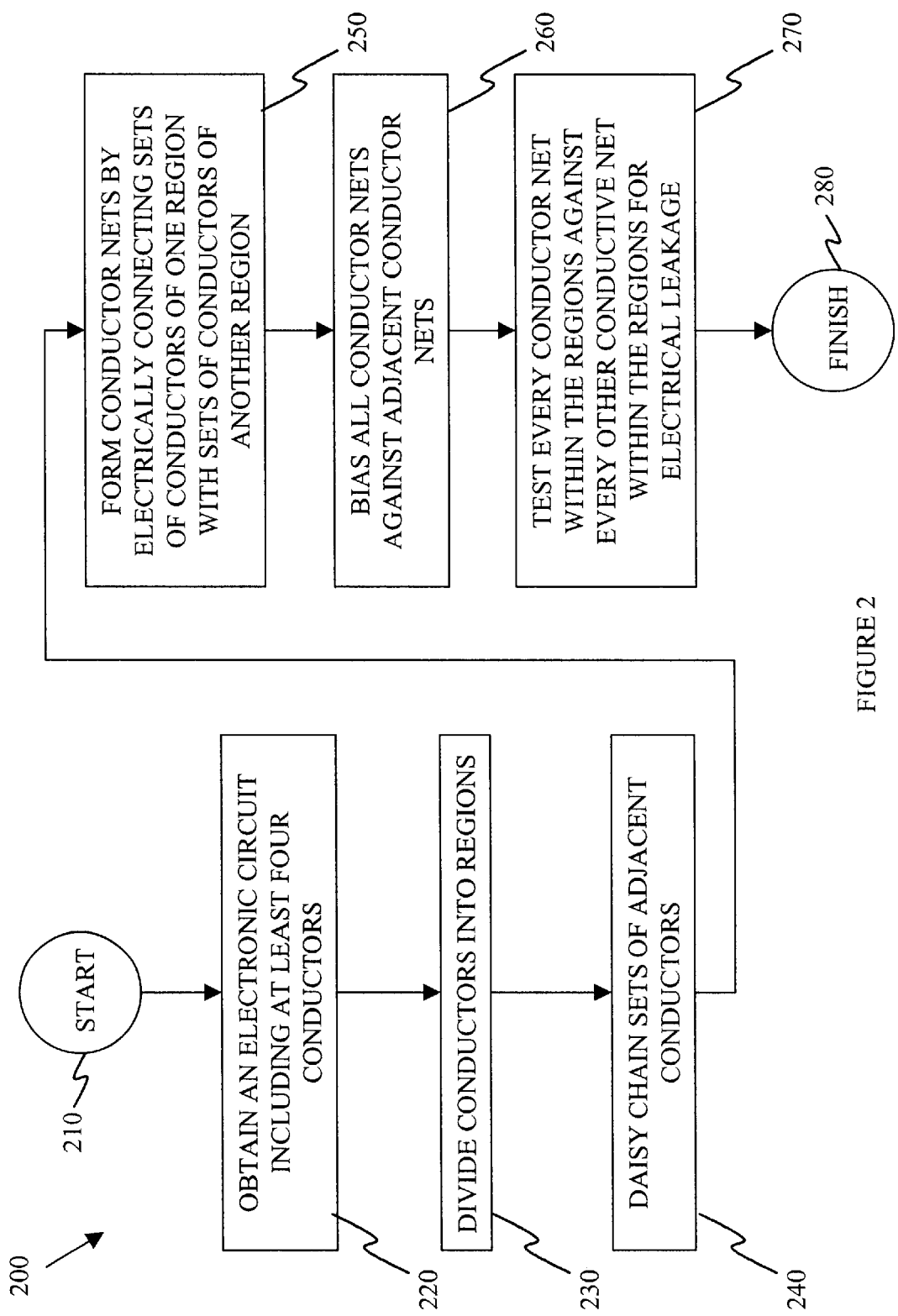
FIG. 2 illustrates a flow diagram of a method for reliability testing leakage characteristics in an electronic circuit, which is in accordance with the principles of the present invention.

Turning now to FIG. 2, illustrated is a flow diagram 200 of a method for reliability testing leakage characteristics in an electronic circuit, which is in accordance with the principles of the present invention. While the aforementioned method will be discussed with respect to testing leakage characteristics in an electronic circuit 300 shown in FIGS. 3–7, it should be understood that the method should not be limited to such an example, and that other electronic circuits may be tested.

Figure 3:
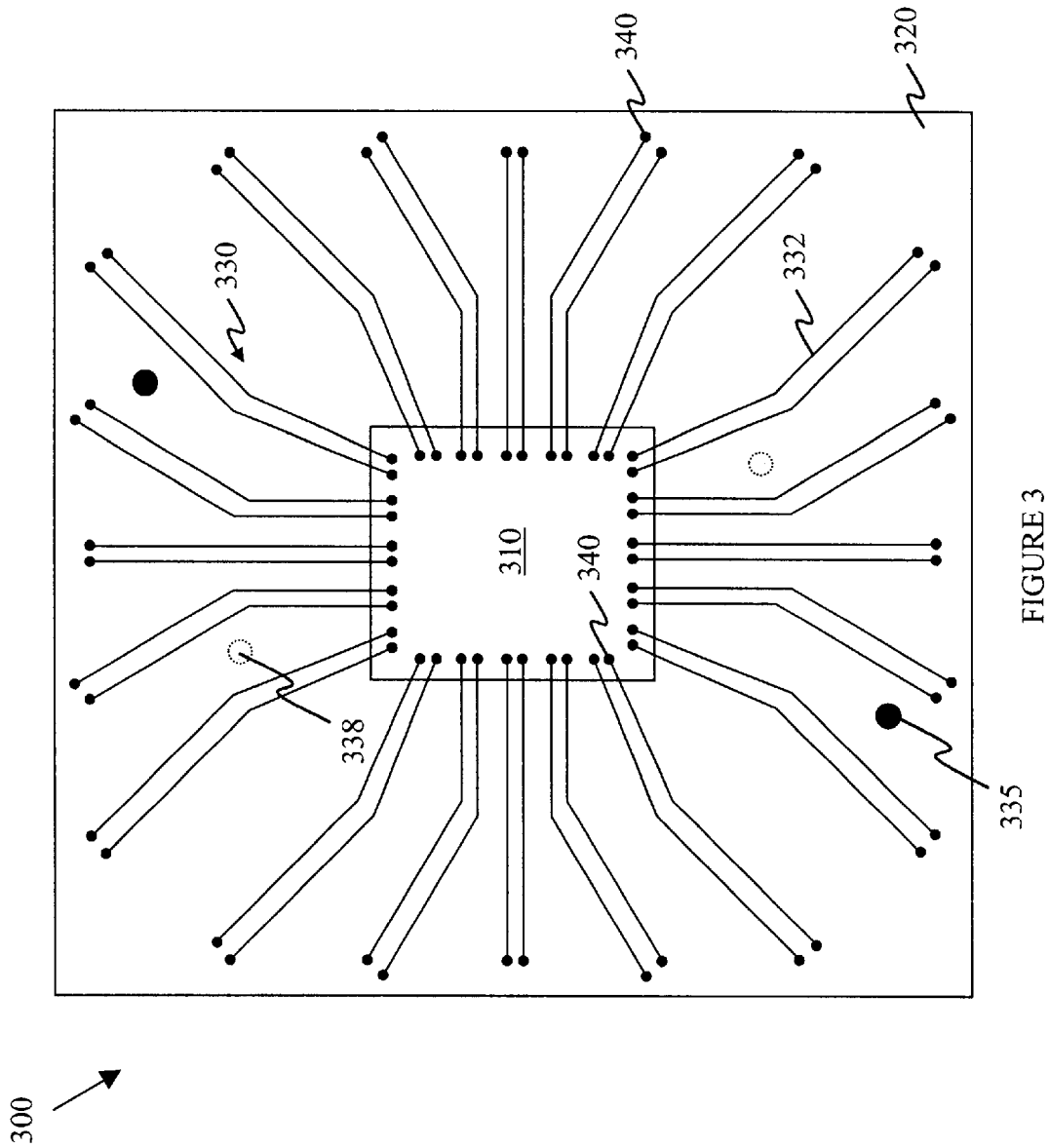
FIG. 3 illustrates a plan view of an embodiment of an electronic circuit that might be tested in accordance with the principles of the present invention.

In FIG. 2, the method begins in a start step 210. Subsequent to the start step 210, an electronic circuit having at least four conductors should be obtained in a step 220. Turning to FIG. 3, illustrated is a plan view of an embodiment of an electronic circuit 300, which might be obtained in the step 220, and tested in accordance with the principles of the present invention. The electronic circuit 300 may comprise a variety of circuits having various structures and sizes. In the illustrative embodiment shown in FIG. 3, the electronic circuit 300 comprises a semiconductor device. It should be understood that any semiconductor package technology, including ball grid array (BGA), chip scale package (CSP) or another similar technology, is within the scope of the present invention. It should also be understood that the electronic circuit 300 may comprise either a ceramic or plastic technology, as well as either a wirebond or flip chip technology. While certain examples of the electronic circuit 300 have been given, it should be noted that other variations, not shown or discussed, exist.

As illustrated, the electronic circuit 300 may include both a die region 310 and a package region 320. The die region 310, which may comprise both active or passive devices, typically includes any working circuitry of the electronic circuit 300. The package region 320 typically includes conductors 330, such as traces, which might be used to provide signals and voltages to the active and passive devices located within the die region 310.

In the embodiment illustrated in FIG. 3, the conductors 330 comprise signal traces 332, voltage traces 335 and ground traces 338. It should be understood, however, that other types of conductors 330 are within the scope of the present invention. As illustrated, both ends of the conductors 330 may terminate with a conductive termination 340, such as a solder ball or another well known conductive termination 340.

Referring back to FIG. 2, subsequent to obtaining the electronic circuit in the step 220, the conductors of the electronic circuit may be divided into at least two noninterleaved regions, wherein each of the regions includes at least two conductors, in a step 230. The number of noninterleaved regions that may be used may vary, however, as previously stated each noninterleaved region should have at least two conductors. In an exemplary embodiment of the invention, up to about 9 noninterleaved regions may be used. It should be understood, however, that the number of noninterleaved regions required may depend on the total number of conductors in the electronic circuit, and other various concerns.

Figure 4:
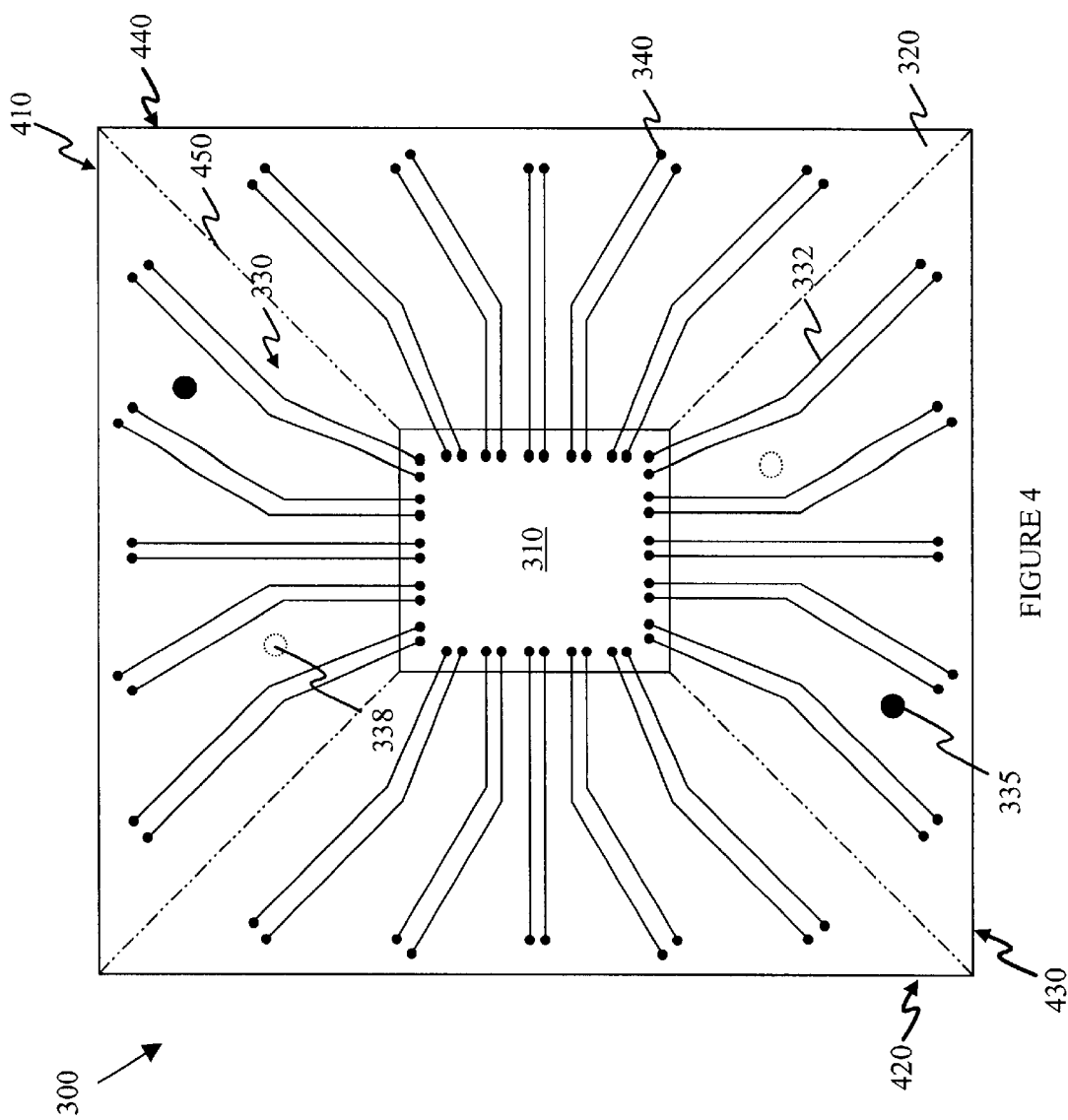
FIG. 4 illustrates a plan view of the electronic circuit illustrated in FIG. 3, after dividing conductors into four noninterleaved regions.

Turning to FIG. 4, shown is a plan view of the electronic circuit 300 illustrated in FIG. 3, after dividing the conductors 330 into four noninterleaved regions 410, 420, 430, 440. While the four regions 410, 420, 430, 440 are separated from one another using a dotted line 450, one skilled in the art understands that the dotted line 450 only represents a virtual division of the four regions 410, 420, 430, 440, and not an actual physical division of the four regions 410, 420, 430, 440.

Referring back to FIG. 2, in an optional step 240, sets of adjacent conductors within a same region may be formed. The sets of adjacent conductors may be formed in an effort to reduce the number of conductors that are required to be biased and tested in a subsequent step.

Figure 5:
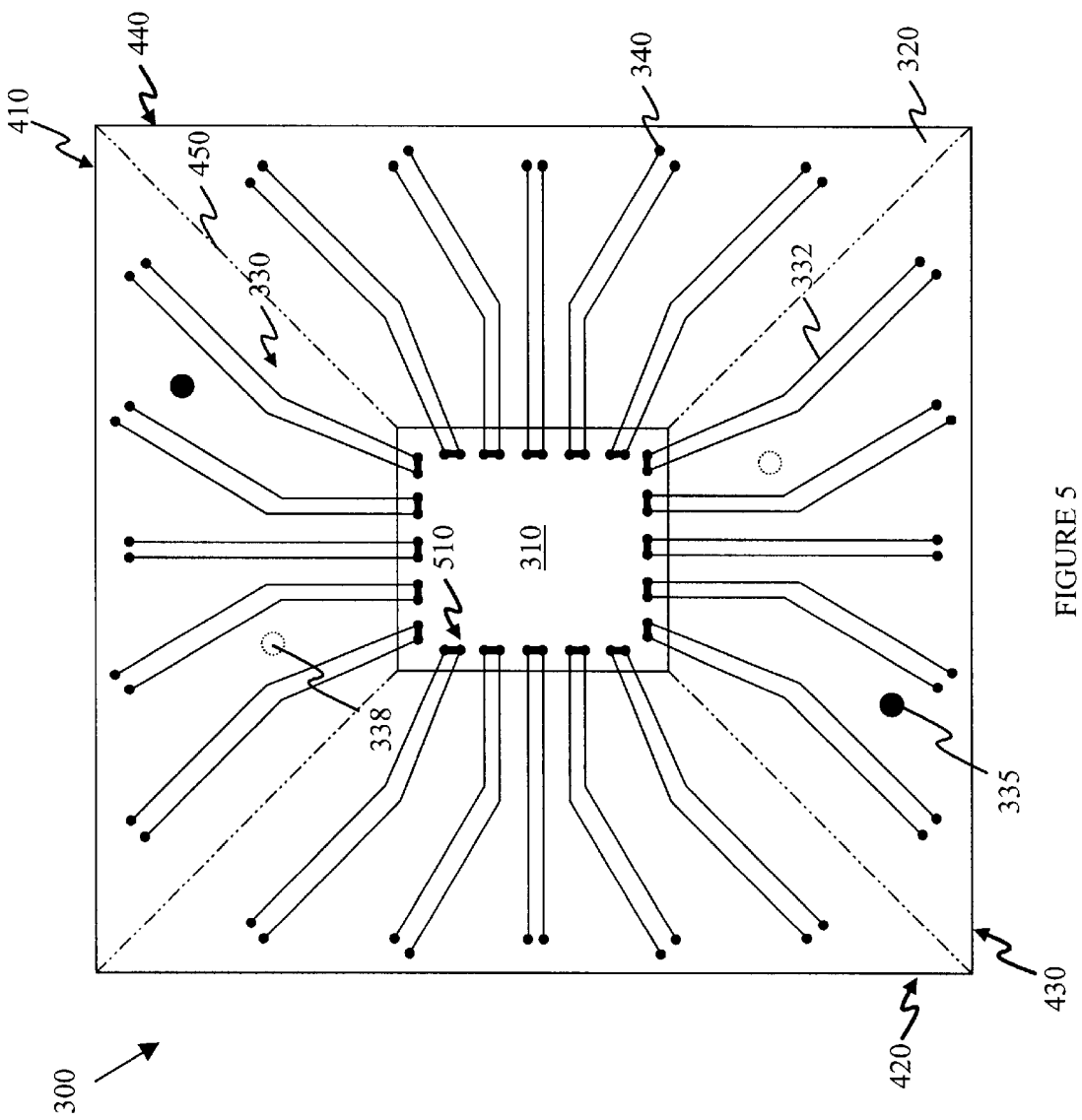
FIG. 5 illustrates a plan view of the electronic circuit illustrated in FIG. 4, after forming sets of adjacent conductors.

Turning to FIG. 5, illustrated is a plan view of the electronic circuit 300 illustrated in FIG. 4, after forming sets of adjacent conductors 510. While it has been illustrated that the sets of adjacent conductors 510 are separated into pairs, one skilled in the art understands that the sets of adjacent conductors 510 may comprise any number of adjacent conductors 330. The sets of adjacent conductors 510 may be formed by electrically connecting sets of adjacent conductors 330 in each of the regions 410, 420, 430, 440. In the illustrative embodiment shown in FIG. 5, the sets of adjacent conductors 510 are formed by electrically connecting adjacent conductors 330 in the die region 310. It should be noted, however, that other means for electrically connecting the adjacent conductors 330 exist.

One method known for electrically connecting adjacent conductors 330 in the die region 310 includes using a daisy chained die. The daisy chained die is a die that may be electrically coupled to the electronic circuit 300 during testing, however, a die that may be removed from the electronic circuit 300 after testing is complete. It should be noted that the step of daisy chaining adjacent conductors 330 to form sets of daisy chained conductors is an optional step, therefore, it might only be used in certain embodiments. It should further be noted that it is not required that the daisy chained die be on adjacent conductors 330, however, certain considerations should be taken if this is not the case.

Referring back to FIG. 2, after optionally forming sets of adjacent conductors in the step 240, conductor nets are formed by electrically connecting conductors of one region with conductors of the other regions in a step 250. By connecting conductors of one region with conductors of the other regions to form conductor nets, the number of individual electrical access points to traces that need be biased and tested may be reduced. This allows such a device to be biased and tested much easier, much faster, and much more cost efficiently.

Figure 6:
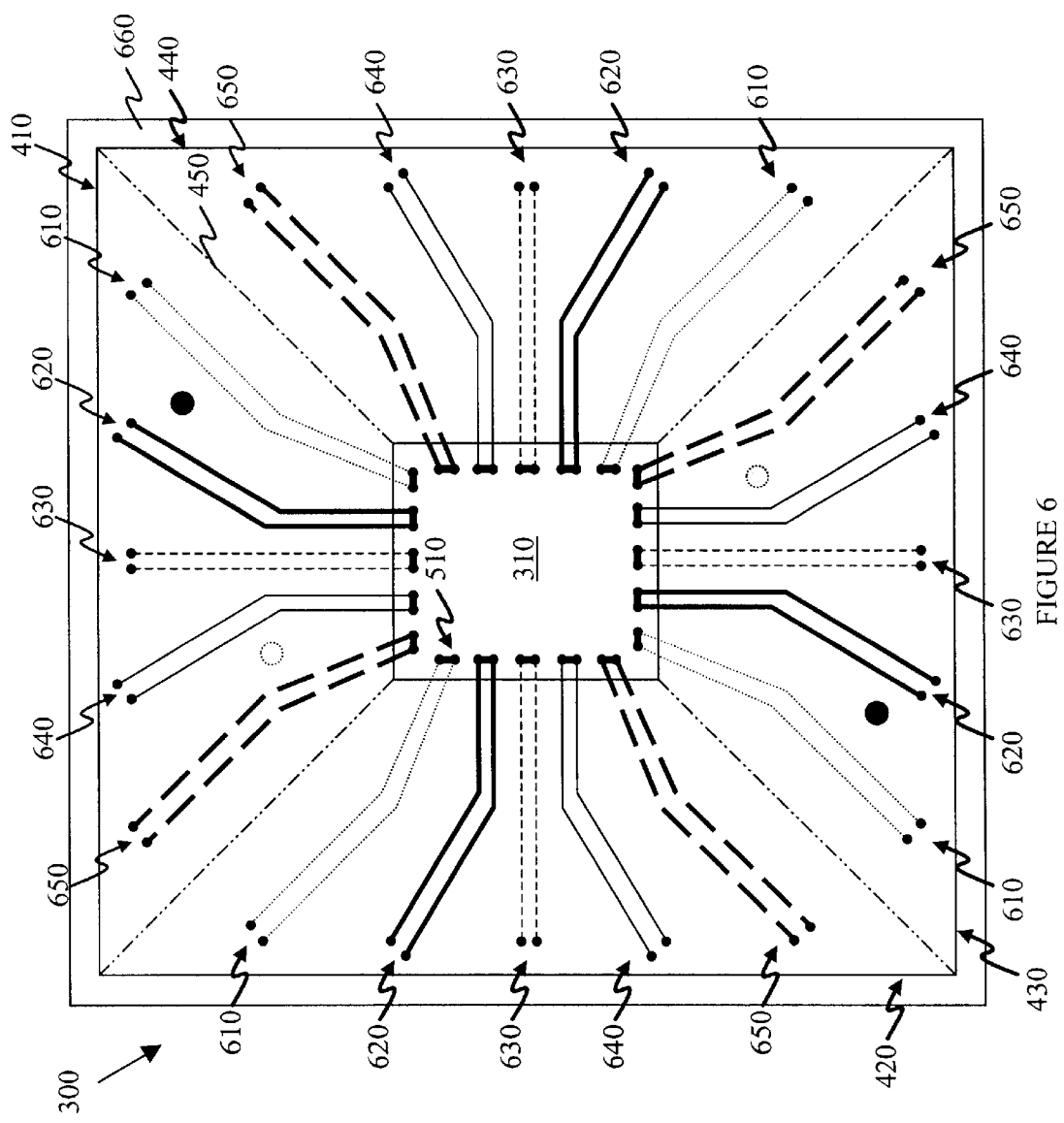
FIG. 6 illustrates a plan view of the electronic circuit illustrated in FIG. 5, after forming conductor nets.

Turning to FIG. 6, shown is the electronic circuit 300 illustrated in FIG. 5, after electrically connecting ones of the sets of conductors 510 of one region 410, 420, 430, 440 to ones of the sets of conductors 510 in all the other regions 410, 420, 430, 440, thus, forming conductor nets 610, 620, 630, 640, 650, as described in step 250. In the illustrative embodiment shown in FIG. 1, variations in line width and type help depict which sets of conductors 510 are electrically connected. In the given example, like line width and type represents an electrical connection. For example, conductor net 610, which is represented by small dotted lines, includes a set of conductors 510 in each one of the regions 410, 420, 430, 440. The same holds true with the conductor nets 620, 630, 640, 650, as well as any other conductor nets and regions that might be employed in the present invention. It should be noted that all the voltage traces 335 and all the ground traces 338, respectively, may also be electrically connected to form voltage connector nets and ground connector nets.

In the illustrative embodiment shown in FIG. 6, the sets of conductors 510 coupled in each of the regions 410, 420, 430, 440 are symmetric to one another. For example, in one embodiment, the clockwise most set of conductors 510 in each of the regions 410, 420, 430, 440 could be electrically connected to form the conductor net 610. Additionally, the next most clockwise set of conductors 510 in each of the regions 410, 420, 430, 440 could be electrically connected to form the conductor net 620, and so on. While sets of conductors 510 are illustrated as being electrically connected in FIG. 6, one skilled in the art understands that step 240 could have been omitted, resulting in single conductors 330 in opposing regions 410, 420, 430, 440 being electrically coupled to form the conductor nets 610, 620, 630, 640, 650.

The conductor nets 610, 620, 630, 640, 650 may be formed using many devices. In an exemplary embodiment, a reliability test board 660 may be used to electrically connect the sets of conductors 510 to a DUT board which chains them together to form the conductor nets 610, 620, 630, 640, 650. As previously discussed with respect to FIG. 1, a DUT board/socket combination is particularly useful as the reliability test board 660. However, other devices for forming the conductor nets 610, 620, 630, 640, 650 are within the scope of the present invention.

Figure 7:
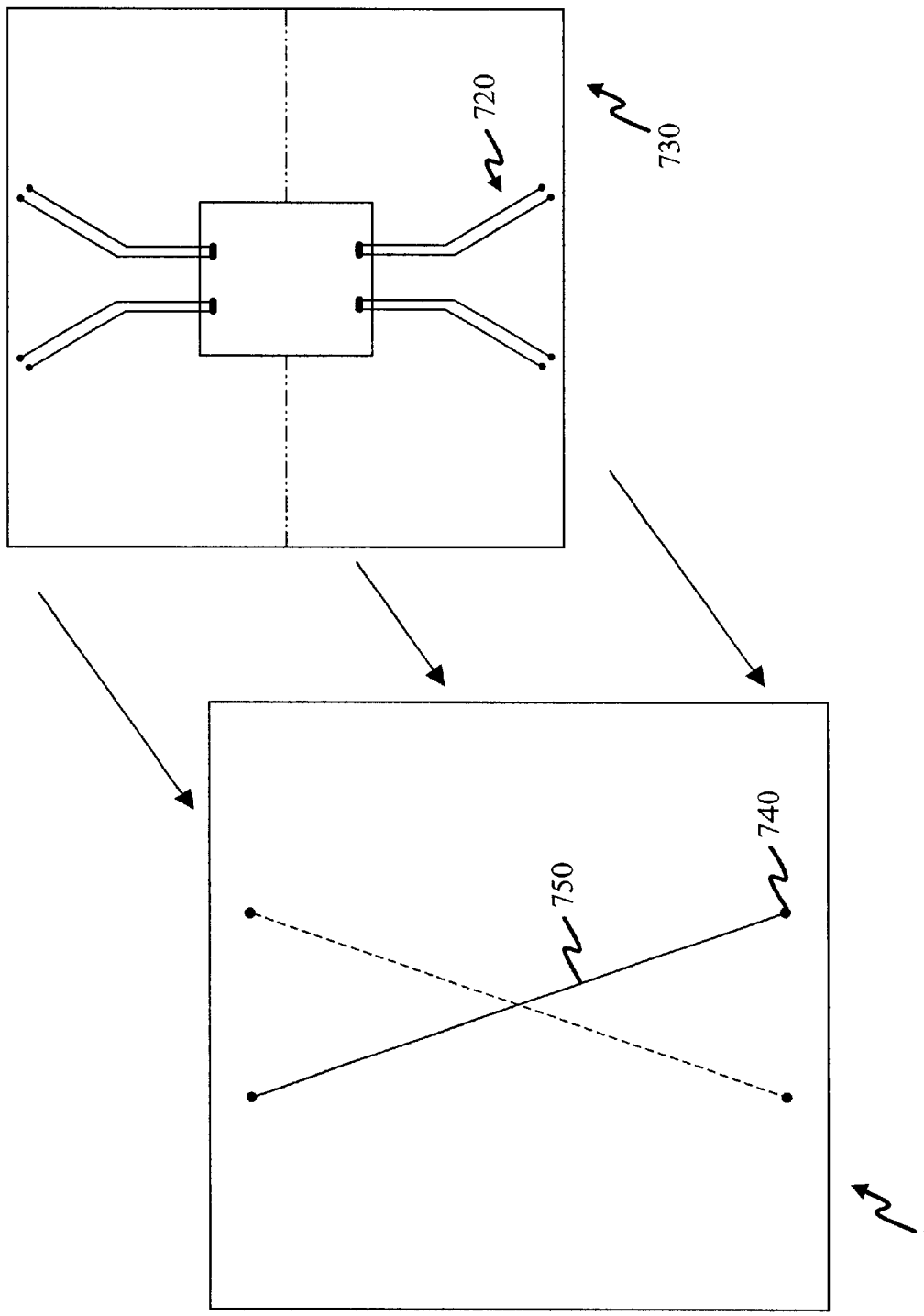
FIG. 7 illustrates an example of how a reliability test board may be used to electrically connect sets of conductors of an electronic circuit.

Turning to FIG. 7, illustrated is an example of how a reliability test board 710 may be used to electrically connect sets of conductors 720 of an electronic circuit 730, thus, forming conductor nets. For ease of understanding and discussing, a simplistic example has been illustrated in FIG. 7. It should be understood, however, that while a simplistic example has been illustrated in FIG. 7, the principles taught with respect to FIG. 7 may be applied to electronic circuits having much more complex arrangements.

In the illustrative embodiment shown in FIG. 7, the reliability test board 710 includes reliability test board pins 740 and reliability test board conductors 750. In the current embodiment, the reliability test board pins 740 are designed to electrically contact each set of conductors 720 of the electronic circuit 730, as the electronic circuit 730 is being located there over. The reliability test board pins 740 may be any conductive material, such as a solder ball, which is capable of accurately contacting each of the sets of conductors 720. As further illustrated, the reliability test board conductors 750 electrically connect various reliability test board pins 740, thereby creating an electrical connection there between. Because there is an electrical connection between various reliability test board pins 740, and the reliability test board pins 740 electrically contact the sets of conductors 720, conductor nets are formed. It should be understood that the reliability test board 710 shown in FIG. 7, is only one illustrative embodiment of the reliability test board. Other variations exist, and are, therefore, within the scope of the present invention.

Referring back to FIG. 2, after completion of the conductor nets in step 250, each of the conductor nets could be biased against every other adjacent conductor net in a step 260. In an exemplary embodiment, this would be accomplished by biasing one conductor net with a high voltage and biasing the adjacent conductor net with a lower voltage. For example, a first conductor net could be biased with a voltage of about +3.3 volts and a second adjacent conductor net could be biased with a voltage of about 0 volts. While certain voltages have been expressed, it should be understood that various voltages are within the scope of the present invention.

In the illustrative embodiment shown in FIG. 6, conductor net 610 could be biased with a high voltage, conductor net 620 could be biased with a lower voltage, conductor net 630 could be biased with a higher voltage, conductor net 640 could be biased with a lower voltage and conductor net 650 could be biased with a higher voltage. In a typical situation, this would accelerate any associated leakage characteristics, such that the leakage could be realized in a more timely manner.

Because groupings of conductors 330 have been electrically connected in the form of conductor nets 610, 620, 630, 640, a reduced number of pins may be used to bias each of the conductors 330 and to test circuit functionality after reliability testing (biasing) is complete. In the illustrative embodiment shown in FIG. 6, the number of pins required to bias and subsequently test the electronic circuit 300 may be calculated using the equation $$\left(\frac{N}{PM}\right)+V,$$

wherein N is a number of signal conductors 332, P is a number of noninterleaved regions, M is a number of adjacent conductors in each set of conductors 510, and V is a number of voltage conductor nets and ground conductor nets. In the particular embodiment illustrated in FIG. 6, N=40, P=4, M=2 and V=2, resulting in a pin tester requiring 7 pins. Had optional step 240 not been performed, M would equal 1, resulting in a pin tester requiring 14 pins. This is a drastic improvement over the prior art, wherein the prior art would require a single 40 pin tester to accomplish the test, or alternatively, use a smaller pin tester with several iterations.

Referring back to FIG. 2, after the conductor nets have been biased in the step 260, the conductor nets may be tested for electrical leakage in a step 270. Testing for electrical leakage includes looking for shorts, which may have been caused by the biasing performed in step 260, between each conductor net and every other conductor net. In an exemplary embodiment, the conductor nets are tested against one another as well as against the voltage conductor nets and the ground conductor nets. After testing each of the conductor nets against one another, and against the voltage conductor nets and ground conductor nets, the process may finish in a step 280.

Figure 8:
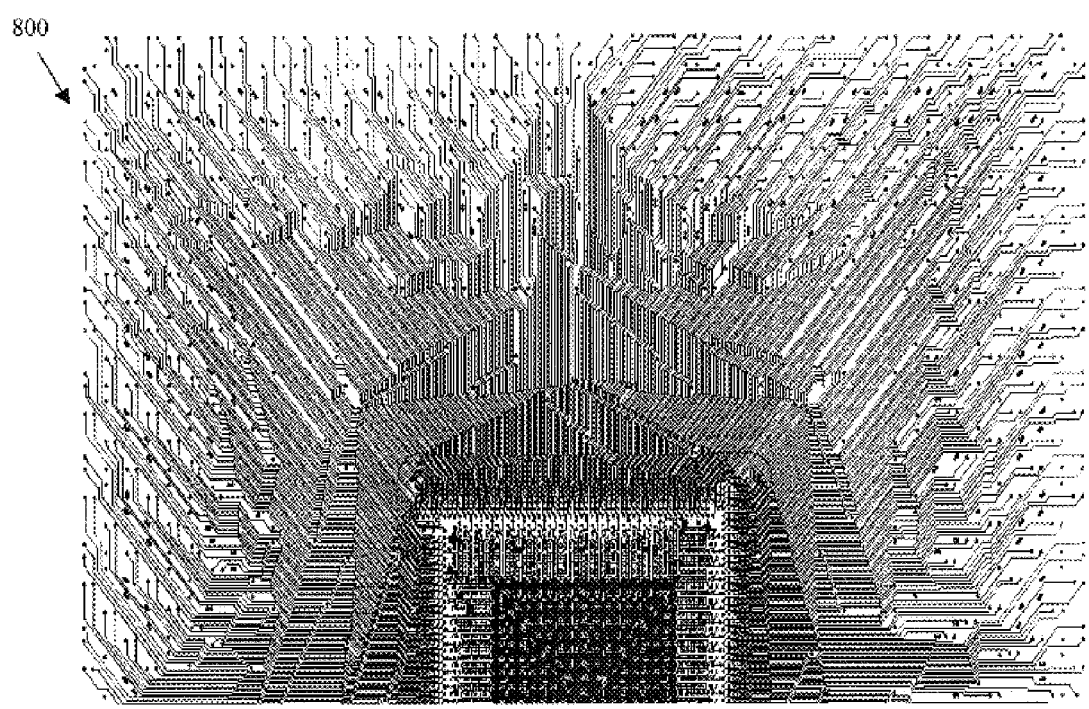
FIG. 8 illustrates a half plan view of an actual electronic circuit, which is in accordance with the principles of the present invention.

Turning briefly to FIG. 8, illustrated is a half plan view of an actual electronic circuit 800, which is in accordance with the principles of the present invention. By examining the half plan view of the electronic circuit 800, one understands how the aforementioned method is capable of saving large amounts of time and money. The electronic circuit 800 illustrated in FIG. 8 includes 1600 signal conductors, one voltage conductor and one ground conductor. If the electronic circuit were to be divided into 4 regions (step 230) and adjacent conductors were grouped in pairs (step 240), a 200-pin count tester could bias and test the signal nets as described above. This is a dramatic improvement over the prior art, which might require a single 1600 pin count tester, or alternatively, a 200-pin count tester moved eight times to test the signal nets.

Some of the benefits realized by the method described above and the testing device associated therewith include the following: (1) provides a user with a method of providing excellent reliability test coverage (e.g., using a high number of independently tested nets), (2) may leverage the use of existing daisy chained dies, saving the cost of designing and building an additional die that might only be used for reliability testing, (3) alternating high/low biasing scheme provides statistically valid number of closely spaced traces to determine failure rate, (4) cost savings realized for high signal count packages with the use of high throughput and lower cost, as well as being able to use lower pin count testers, and (5) remote distances between conductor nets on the test board ensure no missed failures during testing. While certain benefits that might be realized have been listed, one skilled in the art understands that the list is not all inclusive.

Although the present invention has been described in detail, those skilled in the art should understand that they can make various changes, substitutions and alterations herein without departing from the spirit and scope of the invention in its broadest form.

What is claimed is:

1. A method for reliability testing leakage characteristics in an electronic circuit, comprising:
   dividing conductors of an electronic circuit into at least first and second noninterleaved regions having at least two conductors each;
   forming conductor nets by electrically connecting ones of the at least two conductors of the first region to ones of the at least two conductors of the second region; and
   testing for electrical leakage in the conductor nets.

2. The method as recited in claim 1 wherein the ones of the at least two conductors of the first region are symmetric to the ones of the at least two conductors of the second region.

3. The method as recited in claim 1 further including biasing adjacent conductor nets with differing voltages prior to testing for electrical leakage.

4. The method as recited in claim 1 wherein the conductors are signal conductors and further including dividing voltage conductors of the electronic circuit and ground conductors of the electronic circuit, respectively, into the at least first and second noninterleaved regions, and electrically connecting the voltage conductors to form voltage conductor nets and electrically connecting the ground conductors to form ground conductors nets.

5. The method as recited in claim 4 wherein testing for electrical leakage includes testing for electrical leakage using a pin tester having $$\left(\frac{N}{P}\right)+V$$

pins, wherein N is a number of signal conductors, P is a number of noninterleaved regions and V is a number of voltage conductor nets and ground conductor nets.

6. The method as recited in claim 1 wherein the at least first and second noninterleaved regions include at least four conductors each, and further including daisy chaining sets of adjacent conductors within the regions at a die level, and wherein the ones are the sets of adjacent conductors.

7. The method as recited in claim 6 further including biasing adjacent conductor nets with differing voltages prior to testing for electrical leakage.

8. The method as recited in claim 6 wherein the conductors are signal conductors and further including dividing voltage conductors of the electronic circuit and ground conductors of the electronic circuit, respectively, into the at least first and second noninterleaved regions, and electrically connecting the voltage conductors to form voltage conductor nets and electrically connecting the ground conductors to form ground conductors nets.

9. The method as recited in claim 8 wherein testing for electrical leakage includes testing for electrical leakage using a pin tester having $$\left(\frac{N}{PM}\right)+V$$

pins, wherein N is a number of signal conductors, P is a number of noninterleaved regions, M is a number of adjacent conductors in the daisy chained sets, and V is a number of voltage conductor nets and ground conductor nets.

10. The method as recited in claim 1 wherein dividing conductors of an electronic circuit into at least first and second noninterleaved regions includes dividing conductors of an electronic circuit into up to about 9 noninterleaved regions.

11. A testing device for reliability testing leakage characteristics in an electronic circuit, comprising:

a reliability test board having at least two reliability test board conductors configured to contact and divide an electronic circuit having conductors into at least first and second noninterleaved regions having at least two conductors each, and form conductor nets by electrically connecting ones of the at least two conductors of the first region to ones of the at least two conductors of the second region; and testing circuitry, coupled to the reliability test board, that tests for electrical leakage in the conductor nets.

12. The testing device as recited in claim 11 wherein the ones of the at least two conductors of the first region are symmetric to the ones of the at least two conductors of the second region.

13. The testing device as recited in claim 11 further including biasing circuitry, coupled to the reliability test board, that biases adjacent conductor nets with differing voltages prior to testing for electrical leakage.

14. The testing device as recited in claim 11 wherein the conductors are signal conductors and further including voltage conductors and ground conductors that are divided into the at least first and second noninterleaved regions, wherein the voltage conductors and ground conductors are electrically connected, respectively, to form voltage conductor nets and ground conductor nets.

15. The testing device as recited in claim 14 wherein the testing circuitry includes a pin tester having $$\left(\frac{N}{P}\right) + V$$

pins, wherein N is a number of signal conductors, P is a number of noninterleaved regions and V is a number of ground conductor nets and voltage conductor nets.

16. The testing device as recited in claim 11 wherein the at least first and second noninterleaved regions include at least four conductors each, and further including daisy chained sets of adjacent conductors within the regions at a die level, and wherein the ones are the sets of adjacent conductors.

17. The testing device as recited in claim 16 wherein the conductors are signal conductors and further including voltage conductors and ground conductors that are divided into the at least first and second noninterleaved regions, wherein the voltage conductors and ground conductors are connected, respectively, to form voltage conductor nets and ground conductor nets.

18. The testing device as recited in claim 17 wherein the testing circuitry includes a pin tester having $$\left(\frac{N}{PM}\right) + V$$

pins, wherein N is a number of signal conductors, P is a number of noninterleaved regions, M is a number of adjacent conductors in the daisy chained sets, and V is a number of ground conductor nets and voltage conductor nets.

19. The testing device as recited in claim 11 wherein the electronic circuit has up to about 9 noninterleaved regions.

20. The testing device as recited in claim 11 wherein the electronic circuit comprises a semiconductor device and the conductors are traces included in the semiconductor device.

\* \* \* \* \*